(12) United States Patent
Gray

(10) Patent No.: US 6,658,544 B2
(45) Date of Patent: Dec. 2, 2003

(54) TECHNIQUES TO ASYNCHRONOUSLY OPERATE A SYNCHRONOUS MEMORY

(75) Inventor: Kenneth S. Gray, Jericho, VT (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 419 days.

(21) Appl. No.: 09/748,971

(22) Filed: Dec. 27, 2000

(65) Prior Publication Data

US 2002/0083286 A1 Jun. 27, 2002

(51) Int. Cl.[7] .............................................. G06F 13/00
(52) U.S. Cl. ........................................................ 711/167
(58) Field of Search ................................. 711/105, 167

(56) References Cited

U.S. PATENT DOCUMENTS

| | | | |
|---|---|---|---|
| 4,337,525 A | * 6/1982 | Akatsuka | 365/233 |
| 4,417,328 A | 11/1983 | Ochii | |
| 4,615,017 A | 9/1986 | Finlay et al. | 364/900 |
| 4,849,904 A | 7/1989 | Aipperspach et al. | 364/489 |
| 4,872,143 A | * 10/1989 | Sumi | 365/233.5 |
| 5,029,135 A | * 7/1991 | Okubo | 365/203 |
| 5,107,465 A | 4/1992 | Fung et al. | 365/230.08 |
| 5,187,779 A | * 2/1993 | Jeddeloh et al. | 395/325 |
| 5,191,657 A | 3/1993 | Ludwig et al. | 395/325 |
| 5,357,613 A | 10/1994 | Cantrell et al. | 395/250 |
| 5,384,737 A | 1/1995 | Childs et al. | 365/189.05 |
| 5,625,796 A | 4/1997 | Kaczmarczyk et al. | 395/495 |
| 5,698,876 A | 12/1997 | Yabe et al. | 257/296 |
| 5,727,005 A | 3/1998 | Le et al. | 371/61 |
| 5,883,854 A | 3/1999 | Becker | |
| 5,930,197 A | 7/1999 | Ishibashi et al. | 365/233 |
| 5,982,680 A | 11/1999 | Wada | 365/200 |
| 6,044,024 A | * 3/2000 | Barth et al. | 395/189.08 |
| 6,047,361 A | 4/2000 | Ingenio et al. | 711/167 |
| 6,075,830 A | 6/2000 | Piirainen | 375/354 |
| 6,097,663 A | 8/2000 | Watanabe et al. | 365/230.03 |
| 6,115,783 A | 9/2000 | Murayama | 711/100 |
| 6,178,138 B1 | * 1/2001 | Derbenwick et al. | 365/233 |

* cited by examiner

Primary Examiner—Kevin L. Ellis
(74) Attorney, Agent, or Firm—Peter Zawilski (57) ABSTRACT

Among the embodiments of the present invention, is memory control circuitry (40) that includes a detection circuit (44) and a monostable multivibrator (104). This detection circuit (40) is responsive to a transition of a number of address inputs to generate a trigger signal. The monostable multivibrator (104) is responsive to the trigger signal to change a memory control output signal from a first state to a second state. The monostable multivibrator (40) is further responsive to a memory interlock input signal to change the memory control output signal from the second state to the first state. The memory control circuitry (40) can be coupled to drive a clock input of a synchronous memory (30) to provide for asynchronous operation thereof.

22 Claims, 7 Drawing Sheets

TECHNIQUES TO ASYNCHRONOUSLY OPERATE A SYNCHRONOUS MEMORY

BACKGROUND

The present invention relates to memory, and more particularly, but not exclusively relates to techniques to asynchronously operate a synchronous memory.

Frequently, the devices of a digital system are synchronized by a periodic clock signal. Such systems sometimes include a synchronous memory that utilizes the clock signal to time various internal operations, including the recognition of a valid memory address input. Because a transition in the clock signal can reach different devices at slightly different times, a race condition can sometimes arise. Extreme temperature, power supply voltage levels, and/or other operational extremes can exacerbate these differences. To address such race conditions, device operation can be slowed to improve synchronicity.

Another approach utilizes asynchronous memory devices. An asynchronous memory often includes circuitry to detect a transition in the input memory address to determine address validity instead of relying on a clock signal input as in the case of a synchronous memory. In other arrangements, memory devices are proposed that operate in both synchronous and asynchronous modes. These dual-mode designs are usually of a more complex nature than single-mode designs. U.S. Pat. Nos. 5,107,465 to Fung et al. and U.S. Pat. No. 5,384,737 to Childs et al. are cited as additional sources of background information concerning such memory devices.

It is often desirable to utilize proven designs as much as possible when designing a new circuit—particularly for high device count circuits such as an integrated circuit memory. This desire, coupled with needs for both synchronous and asynchronous memories, indicates a demand to utilize one memory type, such as a synchronous memory, to provide another memory type, such as an asynchronous memory, without requiring a large degree of redesign of the first memory type.

SUMMARY OF THE INVENTION

One embodiment of the present invention is a unique technique to asynchronously operate a synchronous memory. Other embodiments of the present invention include unique methods, systems, and apparatus to provide an asynchronously accessible memory.

Another embodiment includes a synchronous memory and control circuitry coupled to this memory to asynchronously access it. The synchronous memory can include a clock circuit, and the control circuitry can be responsive to one or more address inputs to generate a control signal that is provided to this clock circuit. In a further form, the synchronous memory is operable to provide the control circuitry at least one signal to variably time asynchronous access operations.

Still another embodiment includes specifying an asynchronous memory design with a number of macros, selecting at least one of the macros to include a synchronous memory in the asynchronous memory design, and selecting at least another of the macros to include circuitry in the asynchronous memory design to asynchronously operate the synchronous memory. Collectively, the synchronous memory and the circuitry are arranged to provide an asynchronous memory according to the asynchronous memory design.

Yet another embodiment of the present invention comprises providing a synchronous memory including a clock input, coupling the clock input to circuitry responsive to one or more address inputs, and asynchronously operating the synchronous memory with the circuitry through the clock input.

A further embodiment of the present invention is a system that includes an address bus, a synchronous memory coupled to the address bus, and circuitry including a transition detection circuit and a monostable multivibrator. The detection circuit includes one or more inputs coupled to the address bus, and the monostable multivibrator circuit includes a trigger input coupled to the detection circuit. The monostable multivibrator circuit further includes an output coupled to the synchronous memory. This circuitry can be used to asynchronously operate the synchronous memory.

Accordingly, one object of the present invention is to provide a unique technique to asynchronously operate a synchronous memory.

Another object of the present invention is to provide a unique method, system, or apparatus directed to an asynchronously accessible memory.

Further objects, embodiments, forms, features, benefits, and advantages of the present invention shall become apparent from the description and figures included herewith.

DETAILED DESCRIPTION OF SELECTED EMBODIMENTS

While the present invention may be embodied in many different forms, for the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Figure 1:
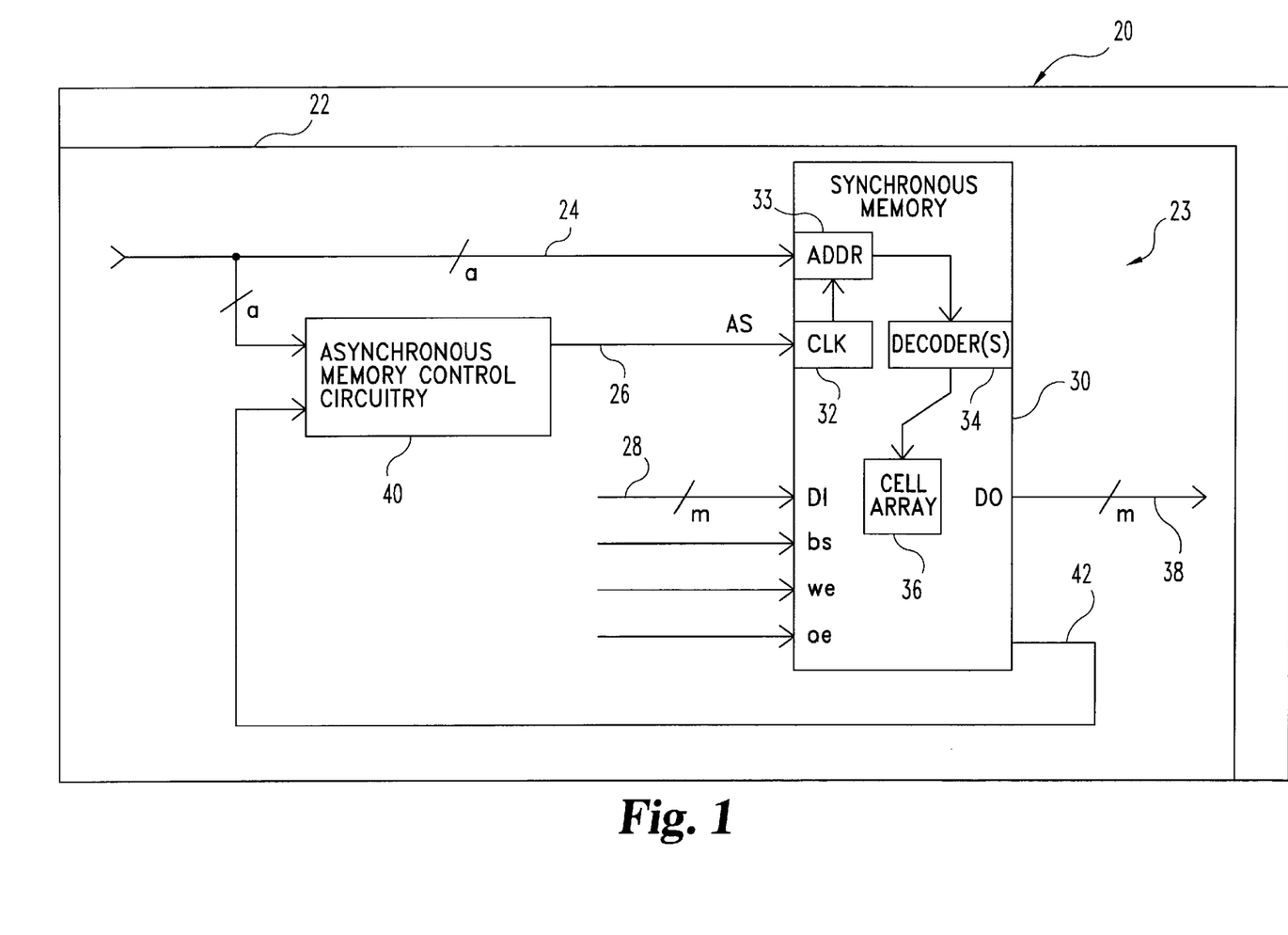
FIG. 1 is a diagrammatic view of a system of one embodiment of the present invention.

FIG. 1 depicts system 20 of one embodiment of the present invention. System 20 includes Integrated Circuit (IC) 22. IC 22 includes a number of components arranged to operate as an asynchronously accessible memory 23. These components include a synchronous memory 30 and asynchronous memory control circuitry 40. Memory address bus 24 is coupled to corresponding inputs of synchronous memory 30 and circuitry 40, and may originate internal or external to IC 22. Address bus 24 has "a" number of signal pathways, and may be arranged to operate as a serial type, parallel type, or a combination of these. In one mode of operation, a plurality of separately addressable memory locations within synchronous memory 30 each correspond to a different multibit address provided by "a" number of bits on address bus 24. Circuitry 40 is also coupled to synchronous memory 30 by signal pathway 26 to provide an asynchronous memory control signal AS to asynchronously access synchronous memory 30 as will be more fully described hereinafter.

Synchronous memory 30 is of a type that has the capability to receive a clock signal input (CLK) from signal pathway 26 to synchronize its internal operation; however, asynchronous memory control signal AS is input on signal pathway 26 instead of a synchronizing clock signal. Synchronous memory 30 includes clock circuit 32 to receive the signal pathway 26 input and address circuit 33 that typically includes one or more registers to hold an address received from bus 24. Clock circuit 32 controls the operation of address circuit 33, including the timing associated with recognition of a new valid memory address input. Synchronous memory 30 also includes address decoder(s) 34 and memory storage cell array 36. Once a valid address is latched into address circuit 33 with clock circuit 32, it is then decoded with decoder(s) 34 of synchronous memory 30 to decode a corresponding memory location in memory storage cell array 36. The particular operation performed with synchronous memory 30 is further defined in a conventional manner with other input signals including: strobe (bs), write enable (we), and output enable (oe). When a write operation is defined by these input signals for a valid address input, "m" bits of data from data input bus 28 are stored in a corresponding memory location of cell array 36 through data input port DI. When a read operation is defined by these input signals for a valid address input, "m" bits of data are output on data output bus 38 from a corresponding memory location of cell array 36 through data output port DO. Besides data output bus 38, another output of synchronous memory 30 corresponds to memory interlock signal pathway 42 that is coupled to circuitry 40 as an input.

Figure 2:
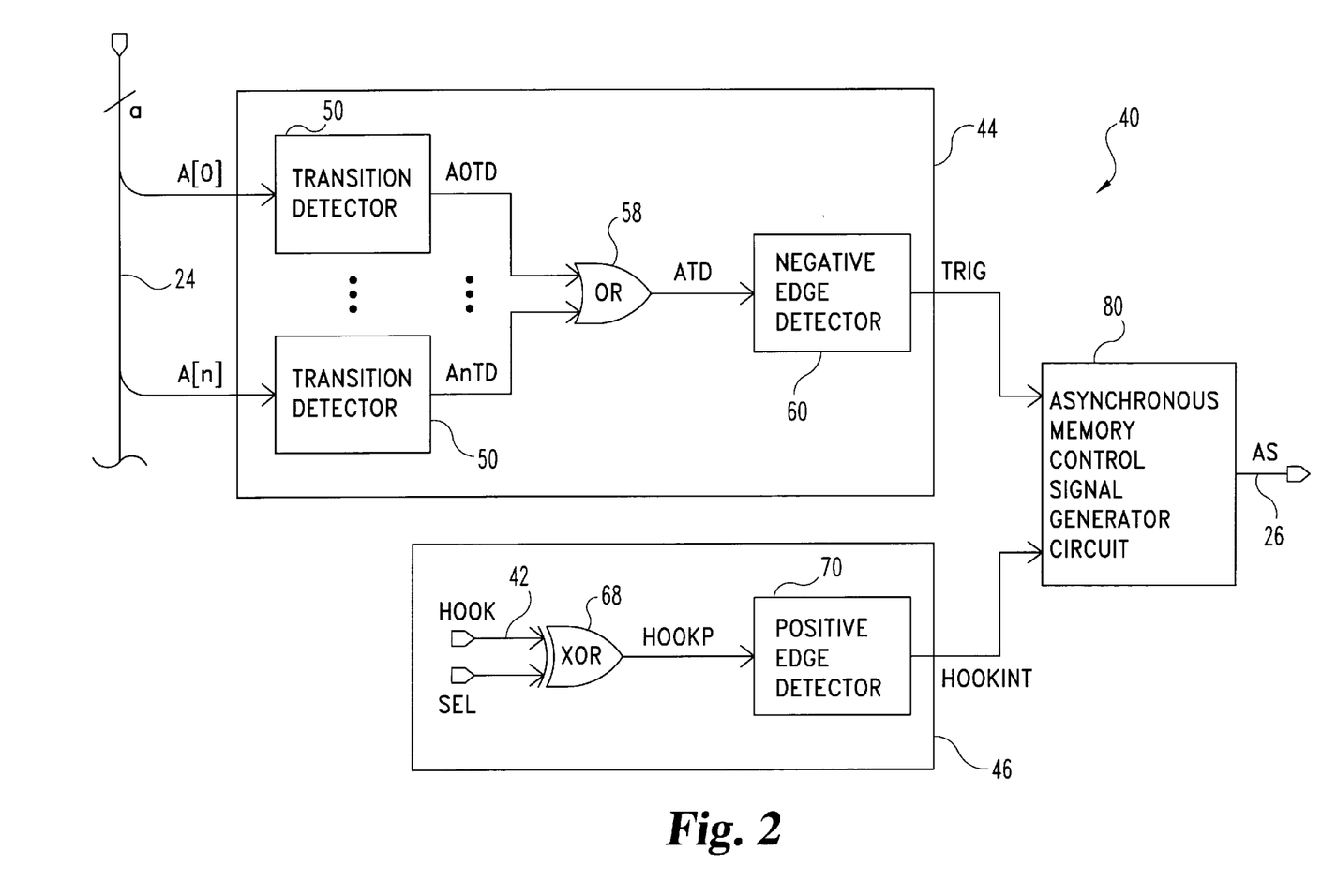
FIG. 2 is diagrammatic view showing details of asynchronous memory control circuitry for the system of FIG. 1.

Referring to the diagrammatic view of FIG. 2, circuitry 40 is further illustrated. Circuitry 40 includes detection circuit 44, interlock circuit 46, and asynchronous memory control signal generator circuit 80. Detection circuit 44 is coupled to address bus 24 to receive the "a" number of address inputs. These input signals are specifically designated as A[0]–A[n]; where "n" is typically the same integer number as the quantity: a+1 (n=a+1). Each address input signal A[0]–A[n] is provided to a corresponding one of a number of transition detectors 50 to provide corresponding transition detector output signals A0TD–AnTD, respectively. The vertical ellipses in FIG. 2 represent the optional inclusion of further transition detectors 50 corresponding to input signals A[1] –A[n−1] and respective outputs for signals A1TD–An−1TD.

Figure 3:
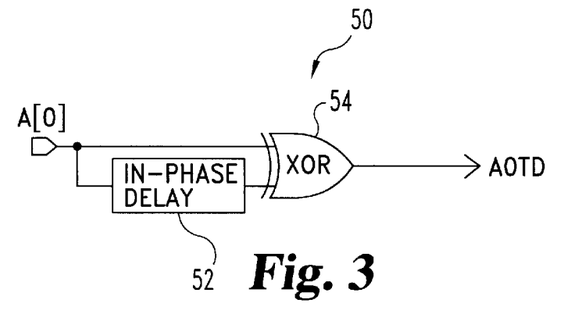
FIG. 3 is a diagrammatic view of a transition detector for the circuitry of FIG. 2.
Figure 6:
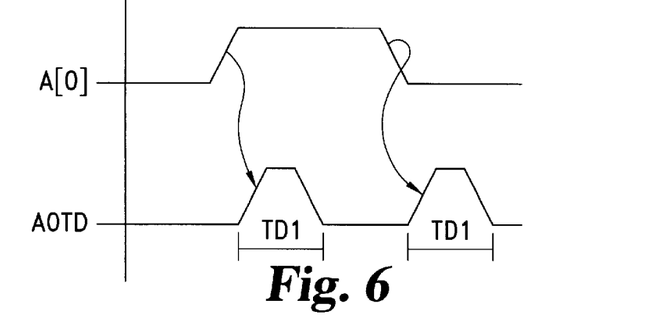
FIG. 6 is a diagram illustrating the relative timing between an input signal and an output signal for the transition detector of FIG. 3.

Referring further to FIGS. 3 and 6, one example of transition detector 50 and its operation are respectively illustrated with the input A[0] and output A0TD pair (input/output pair A[0]/A0TD). It should be understood that transition detector 50 shown in FIG. 3 is the same as and representative of the transition detector 50 for each of the other input/output signal pairs A[1]/A1TD through A[n]/AnTD. For the FIG. 3 illustration, A[0] is input to in-phase delay 52 and two-input exclusive or (XOR) logic gate 54. The in-phase delay 52 is noninverting and operates to output any change is logic level at its input after passage of time delay TD1.

The timing diagram of FIG. 6 shows output pulses for the A0TD signal in relation to the input signal A[0]. It should be appreciated that when both inputs to XOR logic gate 54 are at the same logic level (both high or both low), the output is at a low logic level. Likewise, when the two inputs to XOR logic gate 54 are at different or complementary logic levels, the output is at a high logic level. Because A[0] is provided to one input of XOR logic gate 54 and the delayed A[0] output by in-phase delay 52 is provided to the other input of XOR logic gate 54, a high/low combination of logic state inputs will only be provided to XOR logic gate 54 after A[0] changes state and before the time delay TD1 passes. For example, in FIG. 6, both inputs to XOR logic gate 54 are initially at a low logic level so that A0TD is low. Then, A[0] rises to a high logic level. This high logic level of A[0] is provided more quickly to one input of XOR logic gate 54 than the other due to time delay TD1. Accordingly, a high logic level pulse appears on the output of transition detector 50 as signal A0TD for a duration TD1. Likewise, when A[0] falls to a low logic level, a second high logic level pulse is generated at the output on signal A0TD because of the delay in presenting the change in A[0] to one input of XOR logic gate 54 relative to the other input. As a result, transition detector 50 detects each positive or negative edge of input signal A[0] and generates a corresponding positive pulse for signal A0TD of duration TD1.

Figure 7:
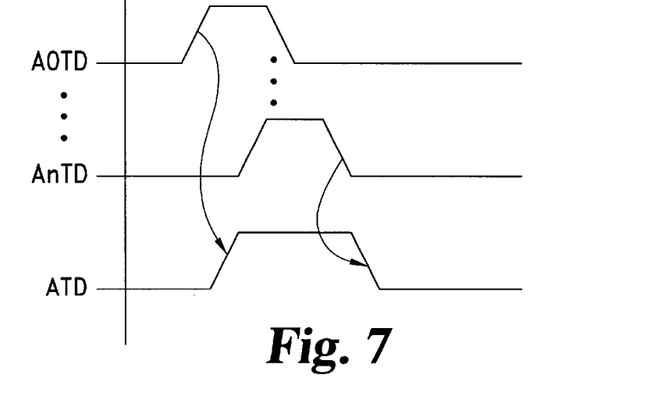
FIGS. 7 and 8 are timing diagrams to compare address input timing differences for the circuitry of FIG. 2.
Figure 8:
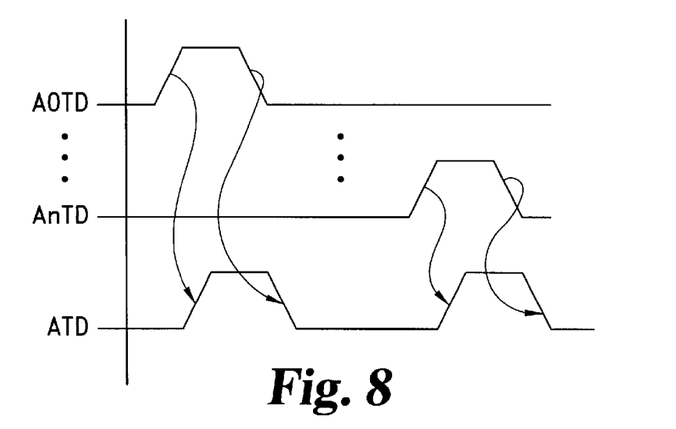

Referring back to FIG. 2, each signal A0TD–AnTD is input to OR logic gate 58, with the number of inputs for OR logic gate 58 being the quantity: n+1. The output of OR logic gate 58 is at a high logic level whenever one or more of the inputs are at a high logic level and is low if all the inputs are at a low logic level. The output of OR logic gate 58 is provided as signal ATD. Referring also to the timing diagrams of FIGS. 7 and 8, two different waveforms for the ATD signal are illustrated. FIG. 7 illustrates a positive pulse for the A0TD and AnTD signals; where each pulse has a duration of time delay TD1. For a given address change on address bus 24, one or more input signals A[0]–A[n] change, resulting in a pair of pulses at each corresponding output of transition detectors 50. As long as at least one of the A0TD–AnTD signals is at a high logic level during a given address transition, a single continuous high logic level pulse is output by OR logic gate 58 as illustrated in FIG. 7. On the other hand, if the changes in the A0TD AnTD signals are spaced apart such that none are at a high logic level for a portion of time before the address transition is over, then multiple output pulses can appear for the ATD signal as shown in FIG. 8. Generally, it is desired that each address transition correspond to one substantially continuous pulse for the ATD signal. Accordingly, the time delay TD1 of transition detectors 50 can be selected to be greater than the expected maximum skew of an address transition on memory address bus 24.

Figure 4:
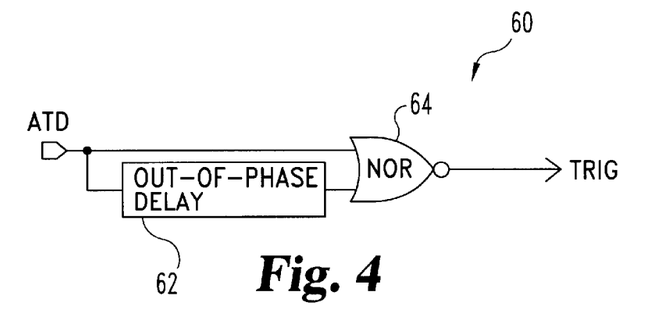
FIG. 4 is a diagrammatic view of a negative edge detector for the circuitry of FIG. 2.

Referring next to FIGS. 2 and 4, the ATD signal is provided from OR logic gate 58 to negative edge detector 60. Negative edge detector 60 includes out-of-phase delay 62 and two-input NOR logic gate 64. Out-of-phase delay 62 operates to output the complement of its input after a time delay TD2. NOR logic gate 64 provides an output as signal TRIG that is only at a high logic level when both inputs are at a low logic level. For any other boolean combination of the two inputs to NOR logic gate 64, its output is at a low logic level. Accordingly, after a passage of time delay TD2 without a change in the logic level of signal ATD, the two-inputs of NOR logic gate 64 are at complementary logic levels, putting the output of NOR logic gate 64 at a low logic level. Further, when the ATD signal rises from a low logic level to a high logic level (a positive transition), the high logic level to one of the inputs of NOR logic gate 64 keeps the TRIG signal at a low logic level. This low level logic output of NOR logic gate 64 is maintained even after time delay TD2 to passes, after which the other input to NOR logic gate 64 becomes low —being inverted by out-of-phase delay 62. However, when the ATD signal falls to a low logic level, the input of NOR logic gate 64 driven by out-of-phase delay 62 initially stays at its low logic level for the time delay TD2. Because both inputs to NOR logic gate 64 are low after a falling ATD signal, a positive pulse is output by NOR logic gate 64 for a time period corresponding to time delay TD2. In other words, a positive pulse of duration TD2 is generated for the TRIG signal in response to each negative edge of the ATD signal. A schematic example of the waveform relationship between the ATD and TRIG signals is provided in the timing diagram of FIG. 9 relative to waveforms for signals A[0], A[n], A0TD, and AnTD.

Figure 5:
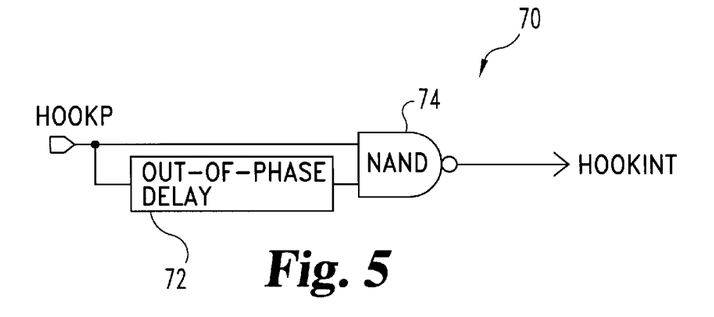
FIG. 5 is a diagrammatic of a positive edge detector for the circuitry of FIG. 2.

Referring next to FIGS. 2 and 5, memory interlock circuit 46 is further described. Circuit 46 is coupled to signal pathway 42 from synchronous memory 30. Synchronous memory 30 provides a memory interlock signal (designated as HOOK) to indicate when a particular memory access has been completed. Circuit 46 includes two-input XOR logic gate 68 and positive edge detector 70. The HOOK signal is provided to one of the inputs of XOR logic gate 68 and an active level selection input signal SEL is provided to the other input of XOR logic gate 68. The SEL signal is set to a logic level appropriate to provide an active high output from XOR logic gate 68 (signal HOOKP). In other words, the SEL signal is set to a high logic level to invert the HOOK signal when it is active low, and is set to a low logic level so the HOOK signal is not inverted when it is active high.

The HOOKP signal from XOR logic gate 68 is input to positive edge detector 70, which outputs active low signal HOOKINT. As illustrated in FIG. 5, positive edge detector 70 includes out-of-phase delay 72 and two-input NAND logic gate 74. The HOOKP signal is provided to the input of out-of-phase delay 72 and one input of NAND logic gate 74. Out-of-phase delay 72 inverts the HOOKP signal input after time delay TD3. NAND logic gate 74 outputs a high logic level for any boolean combination of its two inputs except when both inputs are set to a high logic level, in which case, the output of NAND logic gate 74 is at low logic level.

Figure 9:
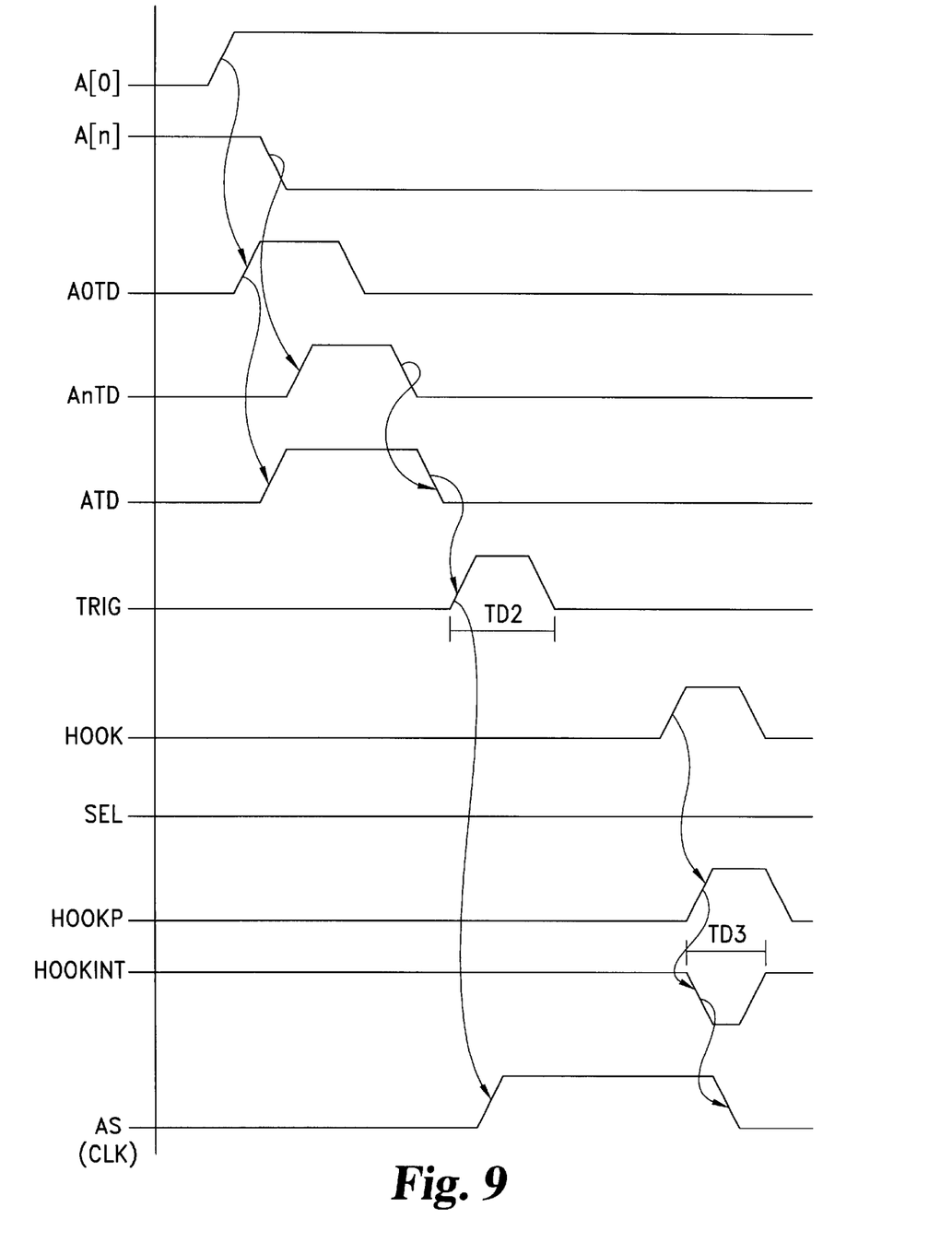
FIG. 9 is a timing diagram for selected signals associated with the circuitry of FIG. 2.

Referring also to the timing diagram of FIG. 9, signal SEL is set active low for an active high form of the memory interlock signal HOOK in this illustration. Referring to the waveforms for the HOOKP and HOOKINT signals, after the HOOKP signal remains at a low logic level longer than delay time TD3, both inputs to NAND logic gate 74 are at complementary logic levels. When the HOOKP signal rises to a high logic level, the input of NAND logic gate 74 driven by the output of out-of-phase delay 72 does not change for time delay TD3, remaining at a high logic level. As a result, in response to the positive going edge of the HOOKP signal, the output of NAND logic gate 74 falls, providing an active low or "negative" pulse for the HOOKINT signal. For this active low condition of the HOOKINT signal, the output of out-of-phase delay 72 falls to a low logic level opposite the high logic level of the HOOKP signal after time delay TD3 passes. As a result, the HOOKINT signal returns to a high logic level. Furthermore, after the HOOKP signal drops to a low logic level, the HOOKINT signal remains unaffected because the output of NAND logic gate 74 remains high if any input is at a low logic level. Thus, positive edge detector 70 detects a positive edge of the HOOKP signal responding with an active low pulse on the HOOKINT signal of duration TD3.

FIG. 9 also presents the timing relationship of asynchronous memory control signal AS output by generator circuit 80 of circuitry 40 as a function of the input signals TRIG and HOOKINT. The generation of the AS signal is further described in connection with the schematic view of circuit 80 in FIG. 10. In generator circuit 80, the TRIG signal is provided to the input of inverter 82. The inverted output of inverter 82 is provided through pass gate 84 to NODE 102. Pass gate 84 can be arranged from a pair of complementary transistor types that are continuously activated by respective control inputs connected to a DC voltage source and ground as shown, to provide a desired resistance R to the output of inverter 82 as will be more fully described hereinafter.

Figure 10:
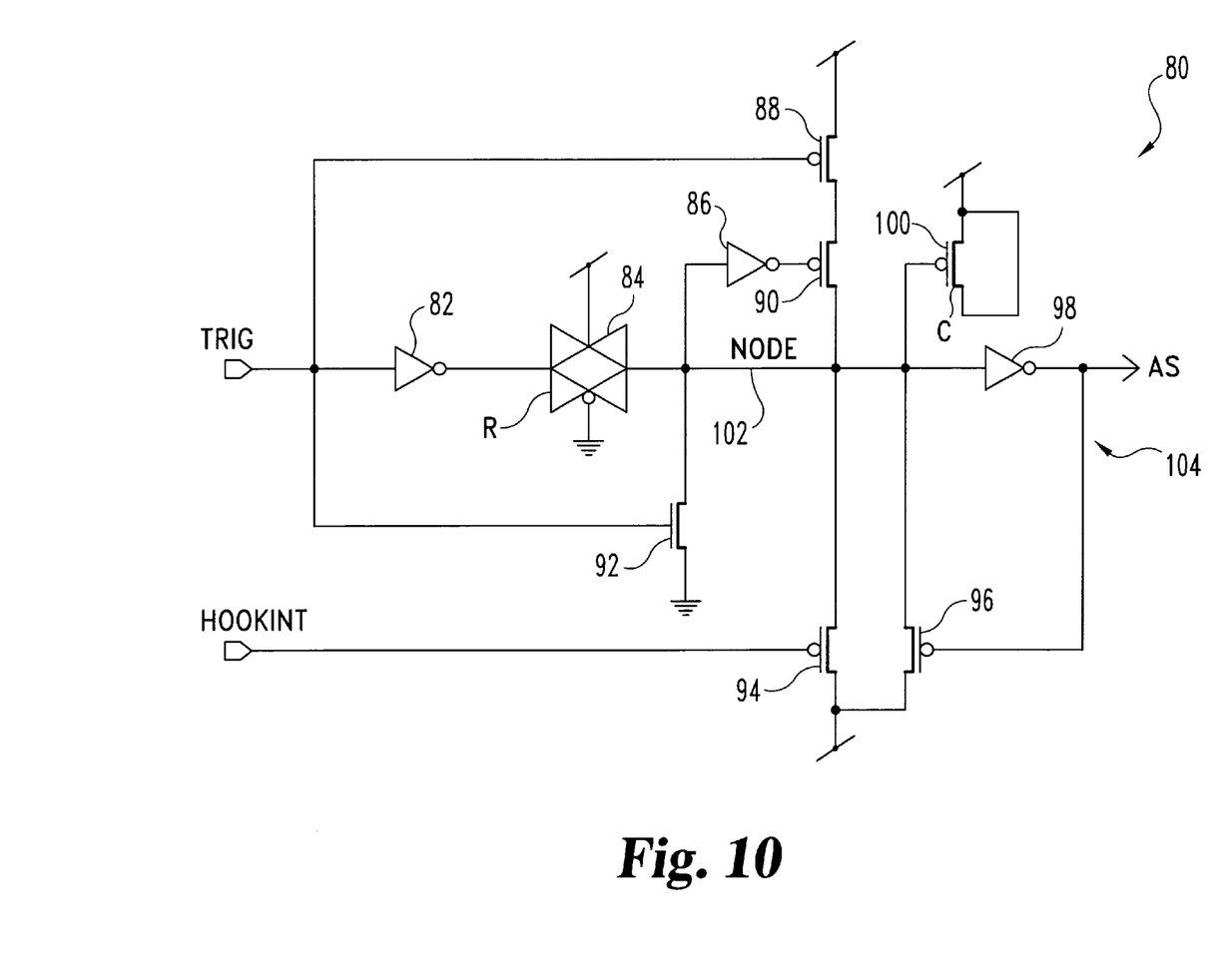
FIG. 10 is a schematic view of the asynchronous memory control signal generator circuit shown in FIG. 2.

The TRIG signal is also provided as an active high control input to transistor device 92 that provides a low resistance path between NODE 102 and ground when activated. The TRIG signal is further provided as an active low control input to transistor device 88 that is coupled in series with transistor device 90. Transistor device 90 is coupled between transistor device 88 and NODE 102 to provide a low resistance pathway to NODE 102 when both transistor devices 88 and 90 are "turned-on" or activated.

The logic level of NODE 102 is input to inverters 86 and 98. The output of inverter 86 is provided as the active low control input to transistor device 90 and inverter 98 outputs the AS signal. NODE 102 is also provided as an active low control input to transistor device 100. Transistor device 100 has its other pathways tied together to the voltage source to selectively provide a desired capacitance C at NODE 102.

The HOOKINT signal is an active low control input to transistor device 94. Transistor device 94 has its other pathways connected to the voltage source and NODE 102, respectively. When turned-on by the HOOKINT signal, transistor device 94 connects NODE 102 to the voltage source with a low resistance pathway. Transistor device 96 has two pathways coupled in parallel with transistor device 94 between the voltage source and NODE 102. The AS signal is provided as an active low control input to transistor device 96.

The transistor devices 88, 90, 94, 96 and 100 for generator circuit 80 can each be in the form of a p-type Insulated Gate Field Effect Transistor (IGFET), such as a PMOS field effect transistor and transistor device 92 can be implemented in the form of a n-type IGFET, such as an NMOS field effect transistor. For such an embodiment, the control inputs correspond to gates and the other transistor connections correspond to sources or drains as appropriate for the particular device type. Likewise, pass gate 84 can be provided by a p-type and n-type IGFET pair. Nonetheless, in other embodiments, bipolar transistors and/or other types of switching devices can be used for one or more of transistor devices 88, 90, 92, 94, and/or 96. Alternatively or additionally, pass gate 84 and/or transistor device 100 can be provided by other device types to provide the desired resistance and capacitance, respectively, as would occur to those skilled in the art.

Figure 11:
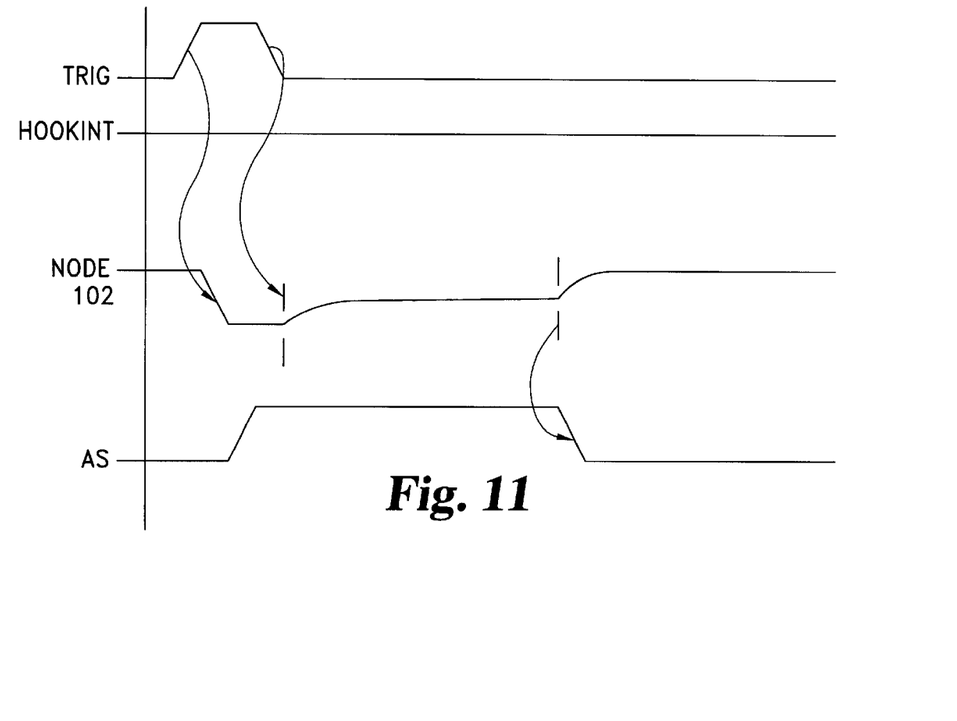
FIGS. 11 and 12 are timing diagrams of selected signals associated with the circuit of FIG. 10 relative to the absence or presence of a memory interlock signal, respectively.
Figure 12:
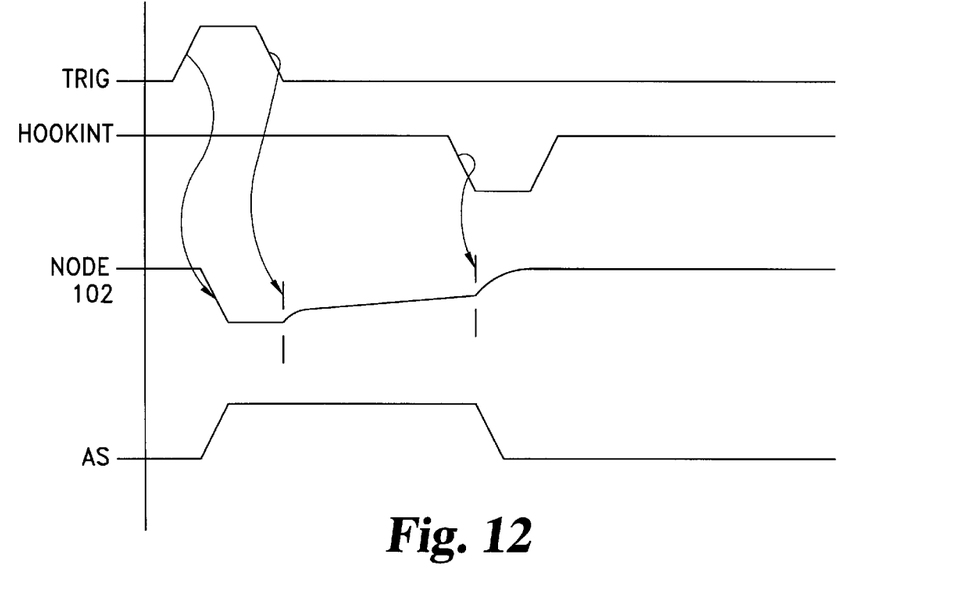

Referring also to the timing diagrams of FIGS. 9, 11 and 12, the operation of generator circuit 80 is next described. When signal TRIG provides a positive pulse to generator circuit 80 (while HOOKINT remains at a high logic level), the output of inverter 82 is driven to a low logic level and transistor device 92 is activated to discharge NODE 102 to ground therethrough. Correspondingly, the input to inverter 86 becomes low generating a high logic level output that keeps transistor device 90 turned-off. The high logic level of the positive pulse for signal TRIG also keeps transistor device 88 inactive. After delay time TD2 passes, the positive pulse for signal TRIG falls. As signal TRIG falls to a low logic level, transistor device 92 is turned-off, isolating NODE 102 from ground. Also, the output of inverter 82 changes state, beginning to charge NODE 102. The time it takes to charge NODE 102 corresponds to the RC time constant provided by the resistance R of pass gate 84 and capacitance C of transistor device 100 and any other stray capacitance or resistance present in the components of generator circuit 80 that bear on the charging of NODE 102. Accordingly, it should be understood that in other embodiments, a desired RC constant may be provided without pass gate 84 and/or transistor device 100.

As the charge on NODE 102 approaches a level sufficient to change the output of inverters 86 and 98, the transistor devices 88 and 90 are activated in series to more quickly pull NODE 102 to a stable high logic state. Also, transistor device 100 will be deactivated, decreasing the capacitance imposed on NODE 102 to further assist in charging NODE 102 to a stable high logic level. With a high logic level input from NODE 102 to inverter 98, signal AS is at a low logic level, which activates transistor device 96. Transistor device 96 is of a low current type that cooperates with inverter 98 to further pull NODE 102 to the high logic state, providing a half-latch that holds NODE 102 at the stable high state until another positive pulse for signal TRIG is received. It should be understood that the recharging of NODE 102 depends on the RC time constant associated therewith, and takes place independent of the state of the signal HOOKINT. The timing diagram of FIG. 11 compares the timing of a waveform for NODE 102 to waveforms for the TRIG and AS signals, while the HOOKINT signal stays constant.

Once the AS signal transitions to a high logic level in response to a positive pulse for the TRIG signal, the active low HOOKINT signal can be used to variably terminate the positive AS pulse. In this manner, the input to the clock circuit 32 of synchronous memory 30 can be variably adjusted via signal path 26 in response to a memory interlock signal (HOOK) output by synchronous memory 30 that indicates a memory access is complete. In operation, an active low pulse of signal HOOKINT actives transistor device 94, causing NODE 102 to be pulled up to an active high logic state in response. Once again, as NODE 102 rises in response to activation of transistor device 94 by signal HOOKINT, transistor device 100 is turned-off and transistor device 96 is turned-on in response to the transition of the output of inverter 98. Provided signal TRIG is at a low logic level, the series connected transistor devices 88 and 90 are both activated, to also assist with charging of NODE 102. The waveform for NODE 102 is shown relative to waveforms for the TRIG, HOOKINT, AS, and HOOKINT signals in the timing diagram of FIG. 12.

Collectively, the components of generator circuit 80 operate as a monostable multivibrator or one-shot as designated by reference 104. The stable state of monostable multivibrator 104 is a high logic level at NODE 102 (a low logic level of signal AS), with the unstable state being a low logic level at NODE 102 (a high logic level of signal AS). When triggered by the TRIG signal, the default duration of the unstable state is determined by the previously indicated RC time constant while the HOOKINT signal is not present or inactive. However, when the HOOKINT is present, it can be activated to reset the monostable multivibrator 104 to the stable state (NODE 102 at a high logic level and signal AS at a low logic level) more quickly than provided by the associated RC time constant. In one alternative embodiment that does not utilize a memory interlock feature, generator circuit 80 lacks an input for the HOOKINT signal and associated circuitry. In another alternative, synchronous memory 30 provides more than one signal from which a memory interlock signal can be derived. In still other alternative embodiments, an arrangement different than monostable multivibrator 104 can be utilized in generator circuit 80 to provide the AS signal waveform as would occur to those skilled in the art.

Referring generally to FIGS. 1–12, signal AS can be used to asynchronously operate clock circuit 32 of synchronous memory 30 as a function of a memory address transition on memory address bus 24. Further, timing can be adjusted in accordance with a memory interlock signal provided from synchronous memory 30, such as signal HOOK. For applications where a synchronous memory design does not include an interlock memory signal or it is not desired to use it, circuitry 40 can still operate to asynchronously control memory accesses in accordance with address changes.

Many forms of the present invention are envisioned. In one example, the synchronous memory is of a different type. For instance the synchronous memory can be of a single or multiport type, a Dynamic Random Access Memory (DRAM) type, and/or a different type as would occur to those skilled in the art. In another example, an ability to select between an asynchronous operating mode and a synchronous operating mode is provided. This ability can be implemented with a logical switch between circuitry 40 and clock circuit 32 along signal pathway 26. This switch can be operated to selectively route either the signal AS from circuitry 40 to clock circuit 32 or, alternatively a synchronizing clock signal to the clock input of synchronous memory 30. By routing signal AS from circuitry 40 to synchronous memory 30 with such a switch, an asynchronous operating mode is selected. By routing a synchronizing clock signal to the clock input of synchronous memory 30 with such a switch, a synchronous operating mode can be selected.

In yet another example, IC 22 is of an Application Specific Integrated Circuit (ASIC) variety. For this example, at least a portion of the circuitry for IC 22 can be defined through a Hardware Development Language (HDL) such as Verilog or VHDL. HDL may be utilized to specify an arrangement of standard logic cell types through one or more macros to define a desired logic structure. As used herein, a "macro" refers to a logic module described in terms of one or more HDL defined cells. In one version of this arrangement, synchronous memory 30 is provided by one or more macros that have been previously proven to operate correctly through implementation in earlier developed integrated circuitry. For this example, circuitry 40 can be provided by at least one other macro to asynchronously operate the pre-established synchronous memory design. Collectively, the one or more synchronous memory macros and any macros for the asynchronous memory control circuitry can be used to define an asynchronous memory design.

It should be understood that, when a pre-established synchronous memory design is utilized, the degree of redesign relative to the total device count of such a memory can be much less as compared to designing an asynchronous memory from scratch. In one form, a pre-established macro defines a Static Random Access Memory (SRAM) of the synchronous type. This macro is organized with a 128×22 array of 6-transistor (6T) cells, and is implemented with at least 20,000 devices. However, it has been found that this 6T cell SRAM design can be optionally modified to generate a memory interlock signal by adding only about 39 devices. Indeed, for selected applications of the present invention, it is preferred to utilize a previously developed, tested, and implemented synchronous memory design defined by at least one macro. If a memory interlock signal is desired for this previously established synchronous memory that does not have one, it is preferred that any modifications to the pre-defined design to include a memory interlock signal result in an increase in transistor device count of one percent or less ($\leq 1\%$). Nonetheless, for still other embodiments of the present invention, a memory interlock signal may be differently implemented or may be absent. Also, the synchronous memory design and/or macro(s) need not predate the asynchronous memory control circuitry design and/or macro(s) in other embodiments of the present invention.

As an addition or alternative to macros, asynchronous memory control circuitry 40 and/or synchronous memory 30 can be completely or partially implemented with Insulated Gate Field Effect Transistors (IGFETs) through custom integrated circuit design procedures or as would occur to those skilled in the art. Furthermore, some or all of synchronous memory 30 and/or circuitry 40 can be provided by bipolar transistors, or such other device types as would occur to those skilled in the art. In still other embodiments, synchronous memory 30 and/or circuitry 40 can be assembled from two or more discrete components rather incorporated into a single integrated circuit. Moreover, some or all of circuitry 40 can be implemented using different logic and/or device configurations as would occur to those skilled in the art.

All publications and patent applications cited in this specification are herein incorporated by reference as if each individual publication or patent application were specifically and individually indicated to be incorporated by reference. Further, any theory, mechanism of operation, proof, or finding stated herein is meant to further enhance understanding of the present invention, and is not intended to limit the present invention in any way to such theory, mechanism of operation, proof, or finding. While the invention has been illustrated and described in detail in the drawings and foregoing description, the same is to be considered as illustrative and not restrictive in character, it being understood that only selected embodiments have been shown and described and that all equivalents, changes, and modifications that come within the spirit of the inventions as defined herein or by the following claims are desired to be protected.

What is claimed is:

1. A method, comprising:
specifying an asynchronous memory design with a number of macros;
selecting at least one of the macros to include a synchronous memory in the asynchronous memory design, wherein the synchronous memory defined by the at least one of the macros includes a clock input and the circuitry defined by the at least another of the macros includes:
a detection circuit responsive to one or more memory address inputs to generate a trigger signal; and
a monostable multivibrator circuit responsive to the trigger signal to change a control signal provided to the clock input from a first state to a second state and the monostable multivibrator circuit is further responsive to the interlock signal to change the control signal from the second state to the first state;
selecting at least another of the macros to include circuitry in the asynchronous memory design to asynchronously control access to the synchronous memory; and
defining the synchronous memory to provide an interlock signal to the circuitry.

2. The method of claim 1, further comprising fabricating an application specific integrated circuit including an asynchronous memory in accordance with the macros.

3. The method of claim 1, wherein the at least one of the macros corresponds to a synchronous memory design implemented in one or more integrated circuits before said specifying.

4. The method of claim 1, said defining includes adding a plurality of transistor devices to a synchronous memory design to generate the interlock signal, the transistor devices corresponding to no more than a one percent increase in a total number of transistor devices comprising the synchronous memory design.

5. A method, comprising:
providing a synchronous memory including a clock input;
coupling the clock input to circuitry responsive to one or more memory address inputs, wherein the circuitry includes a detection circuit and a one-shot circuit, and further comprising:
detecting a change in state of the one or more address inputs with the detection circuit; and
triggering the one-shot circuit in response to said detecting;
regulating timing of the one-shot circuit with an interlock signal output by the synchronous memory: and
asynchronously operating the synchronous memory with the circuitry through the clock input.

6. The method of claim 5, further comprising specifying the synchronous memory with at least one of a number of macros and the circuitry with at least another of the macros.

7. The method of claim 5, further comprising developing the circuitry to include a pre-established synchronous memory design with an increase in transistor device count of no more than one percent.

8. An apparatus, comprising:
a synchronous memory;
circuitry to asynchronously access said synchronous memory;
wherein said synchronous memory is operable to provide said circuitry at least one signal to variably time the asynchronous access with said circuitry,
wherein said circuitry includes,
an edge detector to generate an interlock pulse in response to a corresponding transition of said at least one signal
a detection circuit responsive to one or more memory address inputs to generate a trigger pulse; and
a one-shot circuit responsive to said interlock pulse and said trigger pulse.

9. The apparatus of claim 8, wherein said circuitry includes logic to select an active state of said at least one signal.

10. The apparatus of claim 8, wherein said circuitry includes means for providing an asynchronous access control signal to a clock input of said synchronous memory.

11. A system, comprising:

an address bus;

a synchronous memory coupled to said address bus; and circuitry including a transition detection circuit and a monostable multivibrator circuit, said transition detection circuit including one or more inputs coupled to said address bus, said monostable multivibrator circuit including a trigger input coupled to said transition detection circuit and an output coupled to said synchronous memory, wherein said synchronous memory is connected to said circuitry by an interlock signal pathway.

12. The system of claim 11, wherein said address bus, said synchronous memory, and said circuitry are included in an integrated circuit.

13. The system of claim 11, wherein said transition detection circuit includes a number of transition detectors each corresponds to a different one of a plurality of the inputs.

14. The system of claim 11, wherein said transition detectors are coupled to an edge detector to generate a trigger signal provided to said trigger input.

15. The system of claim 11, wherein said output is selectively provided to a clock circuit of said synchronous memory.

16. The system of claim 11, wherein said monostable multivibrator includes means to time duration of a control signal pulse provided to said output.

17. An apparatus, comprising: memory control circuitry including a detection circuit and a monostable multivibrator, said detection circuit being responsive to a transition of a number of address inputs to generate a trigger signal, said monostable multivibrator being responsive to said trigger signal to change a memory control output signal from a first state to a second state, said monostable multivibrator being further responsive to a memory interlock input signal to change said memory control output signal from said second state to said first state.

18. The apparatus of claim 17, wherein said detection circuit includes a number of transition detectors each corresponding to a different one of said address inputs and an edge detector coupling said transition detectors together, said edge detector providing said trigger signal.

19. The apparatus of claim 17, wherein said circuitry includes an edge detector to generate a control pulse in response to said interlock input signal, said control pulse regulating timing of said memory control output signal.

20. The apparatus of claim 17, wherein said circuitry includes logic to select an active level of said memory interlock input signal.

21. The apparatus of claim 17, wherein said monostable multivibrator includes at least three logic inverters, a resistive device, and a capacitive device.

22. The apparatus of claim 17, further comprising:

an address bus to provide said address inputs; and a synchronous memory coupled to said address bus, said synchronous memory including a clock circuit responsive to said memory control output signal from said circuitry.

\* \* \* \* \*